United States Patent [19]
Park et al.

[11] Patent Number: 5,892,254
[45] Date of Patent: Apr. 6, 1999

[54] INTEGRATED CIRCUIT CAPACITORS INCLUDING BARRIER LAYERS HAVING GRAIN BOUNDARY FILLING MATERIAL

[75] Inventors: Chang-soo Park; Sang-in Lee, both of Kyungki-do; Hong-ku Paik, Seoul, all of Rep. of Korea

[73] Assignee: Samsung Electronics Co., Ltd., Suwon, Rep. of Korea

[21] Appl. No.: 940,258

[22] Filed: Sep. 30, 1997

[30] Foreign Application Priority Data

Feb. 27, 1997 [KR] Rep. of Korea ............... 1997-6244

[51] Int. Cl.$^6$ ............... H01L 29/76; H01L 29/94; H01L 23/48; H01L 23/52
[52] U.S. Cl. ............... 257/295; 257/750; 257/751
[58] Field of Search ............... 257/295–296, 257/750–754; 438/396

[56] References Cited

U.S. PATENT DOCUMENTS

| | | | |
|---|---|---|---|
| 5,569,961 | 10/1996 | Lee | 257/751 |
| 5,612,574 | 3/1997 | Summerfelt et al. | 257/295 |
| 5,638,319 | 6/1997 | Onishi et al. | 257/295 |
| 5,731,634 | 3/1998 | Matsuo et al. | 257/751 |
| 5,736,449 | 4/1998 | Miki et al. | 438/396 |

OTHER PUBLICATIONS

Lesaicherre et al., "*A Gbit–Scale DRAM Stacked Capacitor With ECR MOCVD SrTiO$_3$ Over RIE Patterned RuO$_2$/TiN Storage Nodes*", Integrated Ferroelectrics, vol. 11, 1995, pp. 81–100.

"*At IEDM, Mitsubishi discusses 1–Gbit process; x–ray litho used*", Solid State Technology, Dec. 1995, p. 36.

Primary Examiner—Tom Thomas
Assistant Examiner—Cuong Quang Nguyen
Attorney, Agent, or Firm—Myers Bigel Sibley & Sajovec

[57] ABSTRACT

A barrier layer is included in an integrated circuit capacitor, between a conductive plug and a lower capacitor electrode. The barrier layer includes refractory metal and grain boundary filling material. The grain boundary filling material preferably is Ce, Zr, Y, Th, Hf, La, Al and/or oxides thereof, and is preferably less that 20 atomic percent of the barrier layer. The barrier layer can reduce and preferably prevent diffusion of oxygen, and can thereby reduce the leakage current and oxidation of the integrated circuit capacitor.

32 Claims, 6 Drawing Sheets

INTEGRATED CIRCUIT CAPACITORS INCLUDING BARRIER LAYERS HAVING GRAIN BOUNDARY FILLING MATERIAL

FIELD OF THE INVENTION

This invention relates to integrated circuit devices and fabrication methods thereof, and more particularly to integrated circuit capacitors and fabrication methods thereof.

BACKGROUND OF THE INVENTION

Capacitors are widely used in integrated circuit devices, such as Dynamic Random Access Memory (DRAM) devices. As DRAM devices become more highly integrated, various approaches for increasing the capacitance within a defined cell area have been proposed. For example, one approach is to thin the dielectric film. A second approach is to make the capacitor three-dimensional to increase the effective area thereof. A third approach is to use a material having a high dielectric constant. These approaches can also be combined.

Unfortunately, in the first approach, when the thickness of the dielectric film is 100 Å or less, the reliability may deteriorate due to Fowler-Nordheim currents. This may limit the ability to fabricate ultra-thin dielectric films.

In the second approach, complicated processes and high product cost may result when fabricating a three-dimensional capacitor, such as a cylindrical type or a pin type capacitor. This may limit the advantages of three-dimensional capacitors.

For the third approach, various proposals for increasing capacitance using a high dielectric contact material have been made. For the high dielectric constant material, ferroelectric materials such as $SrTiO_3$ $Ba(Sr, Ti)O_3$ (BST), $Pb(Zr, Ti)O_3$ (PZT), $Pb(La, Zr)TiO_3$ and $Ta_2O_5$ may be used.

A metal of the platinum group or an oxide thereof has been used for an electrode material of the high dielectric capacitor. It will be understood that the platinum group metals include the following six metals, all of which are members of Group VIII of the periodic system: ruthenium, rhodium, palladium, osmium, iridium and platinum. The platinum group metals have an excellent oxidation resistance, so they are not oxidized even where they contact the high dielectric layer. Further, platinum has an excellent leakage current characteristic. That is, platinum (Pt) has a work function higher than that of high dielectric material such as BST, $SrTiO_3$ and PZT, so that a Schottky barrier is formed at an interface with the high dielectric material, which can provide excellent leakage current characteristics.

However, platinum may react with polysilicon at a temperature of 300° C. or higher, to thereby form silicide. Accordingly, it is known to form a barrier layer for preventing silicide formation, at a lower portion of a platinum electrode. Unfortunately, materials commonly used for the barrier layer, for example metal nitrides such as TiN, TaN or $WN_{1-x}$, may be oxidized during a subsequent heat treatment in an oxygen atmosphere.

In particular, the platinum electrode formation generally is performed at a high temperature so that the surface of the electrode is smooth. Subsequently, a high dielectric constant layer is deposited in an oxygen atmosphere at a high temperature. Unfortunately, oxygen may flow into the barrier layer along a grain boundary of the platinum electrode, and then it may additionally diffuse during the subsequent heat treatment. As a result, nitrogen contained in the barrier layer may be replaced with oxygen, which may cause the barrier layer to peel off.

In order to overcome the above problem, it has been proposed to use a conductive oxide layer such as $RuO_2$ or $IrO_2$ for the capacitor electrode. In FIG. 1, a high dielectric constant capacitor having this structure is shown.

Referring to FIG. 1, reference numerals 10, 11 and 12 indicate an integrated circuit substrate such as a semiconductor substrate, an insulating layer and a conductive plug, respectively. Reference numerals 13, 14 and 15 indicate an ohmic layer, a barrier layer and a lower electrode, respectively. Reference numerals 17 and 19 indicate a high dielectric constant layer and an upper electrode, respectively.

In FIG. 1, the conductive plug 12 is formed of polysilicon, and the barrier layer 14 is formed of a metal nitride such as TiN. Also, the lower electrode 15 is formed of a conductive oxide layer, for example, $RuO_2$. The high dielectric constant layer 17 can be formed of a high dielectric constant material such as BST, PZT, PLZT or $Ta_2O_5$, and the upper electrode 19 can be formed of a metal of the platinum group or an oxide thereof.

Unfortunately, although the conductive oxide layer forming the lower electrode 15 can prevent oxygen diffusion more effectively than platinum, it has a work function similar to that of the high dielectric constant layer, which can cause inferior leakage current characteristics. In order to improve the leakage current characteristics, the contact area between the lower electrode 15 and the high dielectric constant layer 17 can be reduced, for example, by reducing the thickness of the lower electrode 15. However, there may be a limit as to how thin the lower electrode 15 can be made. This is because the lower electrode 15 also functions as an oxygen diffusion barrier layer.

Accordingly, it has also been proposed to thin the lower electrode by forming a sacrificial layer comprising a platinum group metal, between the lower electrode layer and the barrier layer. The sacrificial layer can prevent oxidation as will now be described in connection with FIG. 2.

FIG. 2 shows a high dielectric constant capacitor including a sacrificial layer. Referring to FIG. 2, reference numerals 200, 201 and 203 indicate an integrated circuit substrate such as a semiconductor substrate, an insulating layer and a conductive plug, respectively. Reference numeral 205 indicates an ohmic layer formed of $TiSi_x$, and reference numeral 207 indicates a barrier layer formed of a TiN layer. Also, reference numerals 209 and 211 indicate a sacrificial layer for preventing oxidization and a lower electrode, respectively. Reference numerals 213 and 215 indicate a high dielectric constant layer and an upper electrode, respectively.

The sacrificial layer 209 for preventing oxidization can be formed of a platinum group metal, for example, Ru. Ru reacts with oxygen which flows into the Ru layer during a subsequent processing performed under an oxygen atmosphere at a high temperature, thereby forming $RuO_2$. Accordingly, the sacrificial layer 209 for preventing oxidization blocks oxygen from flowing into the barrier layer 207, which can prevent oxidation of the barrier layer 207.

However, in the above-described high dielectric constant capacitor, the leakage current characteristics may still be inferior. Specifically, it is difficult to prevent oxygen from flowing from the sidewall of the barrier layer 207. Accordingly, oxidization of the barrier layer 207 may not be sufficiently prevented.

SUMMARY OF THE INVENTION

It is therefore an object of the present invention to provide improved integrated circuit capacitors and capacitor fabrication methods.

It is another object of the present invention to provide integrated circuit capacitors including high dielectric constant dielectrics, and fabrication methods that can prevent diffusion of oxygen.

It is yet another object of the present invention to provide improved integrated circuit capacitors and fabrication methods that can reduce oxidation of the barrier layer thereof.

These and other objects are provided, according to the present invention, by including a barrier layer in an integrated circuit capacitor, the barrier layer comprising refractory metal and grain boundary filling material. The barrier layer can reduce and preferably prevent diffusion of oxygen therethrough, and thereby can reduce the leakage current and oxidation of the integrated circuit capacitor.

More specifically, integrated circuit capacitors may be fabricated, according to the invention, by forming a conductive plug on an integrated circuit substrate, and forming a barrier layer on the conductive plug. The barrier layer comprises refractory metal and grain boundary filling material. A lower electrode is formed on the barrier layer, and a high dielectric constant layer is formed on the lower electrode. An upper electrode is formed on the high dielectric constant layer.

The grain boundary filling material is preferably at least one material selected from the group consisting of Ce, Zr, Y, Th, Hf, La, Al and oxides thereof. The grain boundary filling material is preferably less than 20 atomic percent of the barrier layer. The refractory metal is preferably at least one metal selected from the group consisting of Ta, Mo and W. The barrier layer may be formed by co-sputtering from a sputtering target comprising the refractory metal and the grain boundary material.

In alternate embodiments of the invention, an ohmic layer may be included on the conductive plug, and the barrier layer is formed on the ohmic layer. The ohmic layer may comprise titanium silicide.

Many alternate embodiments for lower electrodes may also be provided. In one embodiment, the lower electrode comprises platinum group metal and grain boundary filling material wherein the grain boundary filling material is the same grain boundary filling material as was described above for the barrier layer. The lower electrode may be fabricated by co-sputtering using a sputtering target comprising the platinum group metal and the grain boundary filling material.

Alternatively, the lower electrode can include a first lower electrode layer comprising platinum group metal and grain boundary filling material, and a second lower electrode on the first lower electrode layer, where the second lower electrode layer comprises platinum group metal. In another alternative, the lower electrode may be pure platinum group metal without the grain boundary filling material. In yet another alternative, a layer comprising platinum group metal and grain boundary filling material and a layer comprising platinum group metal are repeatedly formed on the barrier layer to provide a lower electrode which comprises a plurality of alternating layers on the barrier layer.

The barrier layer may include barrier layer sidewalls and the lower electrode may also include lower electrode sidewalls. The high dielectric constant layer may be formed on the lower electrode opposite the barrier on the lower electrode sidewalls and on the barrier layer sidewalls, to provide a three-dimensional capacitor structure.

After forming the high dielectric constant layer, heat treatment of the high dielectric constant layer in an oxygen-containing atmosphere may be performed. The barrier layer reduces and preferably prevents oxidation of the conductive plug.

It will also be understood by those having skill in the art that the abovedescribed methods may be also be used to fabricate conductive electrodes for integrated circuits. In this case, the high dielectric constant layer and the upper electrode need not be formed.

Integrated circuit capacitors according to the invention include a conductive plug on an integrated circuit substrate. A barrier layer comprising refractory metal and grain boundary filling material is included on the conductive plug. A lower electrode is included on the barrier layer, and a high dielectric constant layer is provided on the lower electrode. An upper electrode is provided on the high dielectric constant layer. The composition of the grain boundary filling material may be as described above, and the refractory metal may be as described above. Am ohmic layer may be included between the conductive plug and the barrier layer. The ohmic layer preferably comprises titanium silicide.

As was already described, the lower electrode may comprise platinum group metal and grain boundary filling material. Alternatively, the lower electrode may comprise first and second electrode layers, a single layer of platinum or a plurality of alternating layers, as was described above. If a high dielectric constant layer and an upper electrode are not provided, structures according to the present invention may provide integrated circuit conductive electrodes, which may be used for devices other than capacitors. Accordingly, high performance capacitors and electrodes may be provided.

DESCRIPTION OF THE PREFERRED EMBODIMENTS

Figure 1:
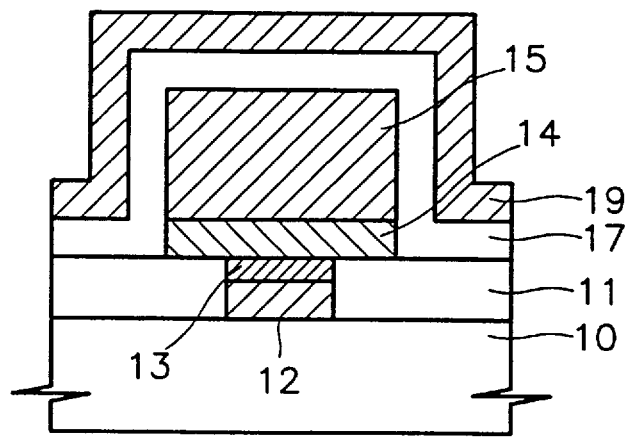
FIG. 1 is a cross-sectional view of a conventional high dielectric constant capacitor.
Figure 2:
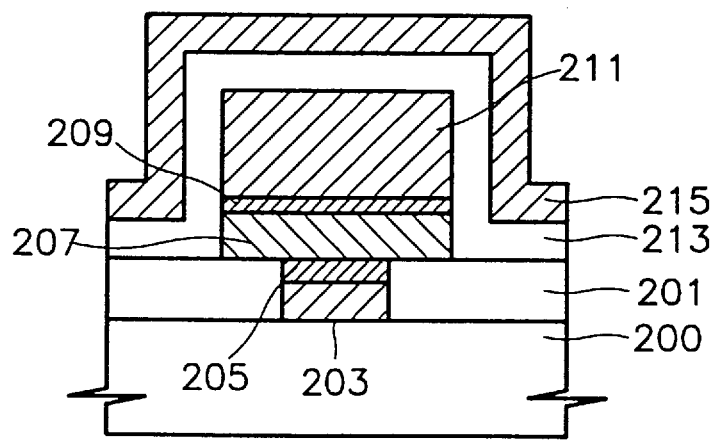
FIG 2 is a cross-sectional view of another conventional high dielectric constant capacitor.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 3:
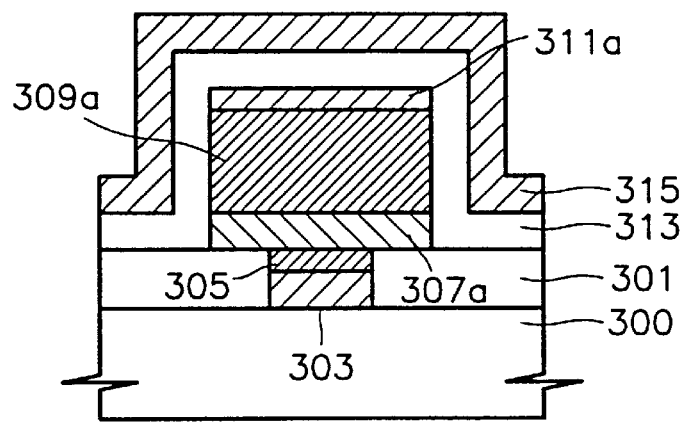
FIG. 3 is a cross-sectional view of high dielectric constant capacitors according to a first embodiment of the present invention.

Referring to FIG. 3, an insulating layer 301 is formed on an integrated circuit substrate such as semiconductor substrate 300, and a conductive plug 303 and an ohmic layer 305 are formed in a predetermined region of the insulating layer 301. A stacked structure is formed on the insulating layer 301 and the ohmic layer 305. The stacked structure includes a barrier layer pattern 307a, a first lower electrode pattern 309a and a second lower electrode pattern 311a.

The barrier layer pattern 307a is formed of refractory metal and grain boundary filling material. The first lower electrode pattern 309a is formed of a platinum group metal and the grain boundary filling material. The second lower electrode pattern 311a is formed of a platinum group metal. A high dielectric constant layer 313 and an upper electrode 315 are also included on the stacked structure.

The conductive plug 303 is formed of polysilicon. The ohmic layer 305 is formed of a metal silicide such as $TiSi_x$ to improve contact resistance.

The barrier layer pattern 307a is formed of a refractory metal, such as Ta, Mo or W, and the grain boundary filling material. The grain boundary filling material fills grain boundaries of the refractory metal so that diffusion paths of metal or oxygen can be reduced and preferably blocked. The filling material should not have chemical affinity with the metals used for an electrode and for an interconnection. Also preferably, it should not form a grain boundary during treatment at high temperature, should have high resistance with respect to high solubility in the metal and silicon and should have a high diffusion rate therein.

Therefore, it is desirable that the filling material have a high melting point, a high thermal stability, high segregation when used with the barrier layer or the electrode material, and a large atomic radius. To this end, it preferably is formed of at least one material selected from a group consisting of Ce, Zr, Y, Th, Hf, La, Al, oxides thereof. Preferably, the oxides have a structure of $MO_{2-x}(0 \leq x \leq 1)$, where M indicates material selected from a group consisting of Ce, Zr, Y, Th, Hf, La and Al.

The amount of the filling material can be changed by the deposition conditions and the composition of a target used for sputtering. As the amount of the filling material increases, the diffusion preventing characteristic may improve but the electrical property may deteriorate.

The first lower electrode pattern 309a is formed of a platinum group metal and grain boundary filling material. As is well known, the platinum group metals include the following six metals, all of which are members of Group VIII of the periodic system: ruthenium, rhodium, palladium, osmium, iridium and platinum. A grain boundary of the metal of a platinum group is filled with the filling material, to block a diffusion path of the metal or oxygen, was the case with the barrier layer pattern 307a. The metal of a platinum group is preferably at least one metal selected from the group consisting of Pt, Ir and Ru, and the filling material is preferably at least one material selected from a group consisting of Ce, Zr, Y, Th, Hf, La, Al and oxides thereof. Thus, multiple filling materials may be used.

The second lower electrode pattern 311a may be formed of a platinum group metal to having good leakage current characteristic. Preferably, Pt, Ir and/or Ru are used.

The high dielectric constant layer 313 can be formed of at least one material selected from the group consisting of BST, PZT, PLZT and $Ta_2O_5$. The upper electrode 315 can be formed of a platinum group metal.

A method for fabricating high dielectric constant capacitors according to one embodiment of the present invention will be described with reference to FIGS. 4A through 4F. In the deposition process for fabricating the high dielectric constant capacitors, it is preferable to use a radio frequency magnetron sputtering system in which deposition chambers are connected by vacuum chambers so that a substrate can move to and from the deposition chamber without exposure to air.

Figure 4A:
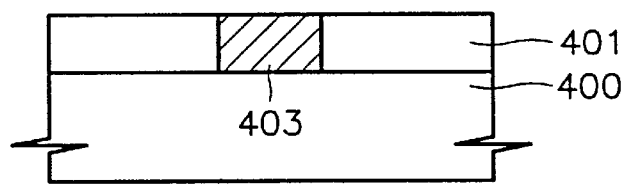
FIGS. 4A through 4F are cross-ssectional views illustrating methods for fabricating the high dielectric constant capacitors according to the first embodiment of the present invention.

FIG. 4A shows the result of forming a conductive plug 403 on the semiconductor substrate 400. In particular, a silicon oxide layer is deposited on a semiconductor substrate 400, to form an insulating layer 401. A predetermined portion of the insulating layer 401 is etched to form a contact hole, and then the contact hole is cleaned. Then, polysilicon including phosphorus for enhancing the conductivity is deposited to a thickness of approximately 3000 Å(±300 Å) on the semiconductor substrate 400 using a vertical LPCVD apparatus to form a conductive plug 403.

Figure 4B:
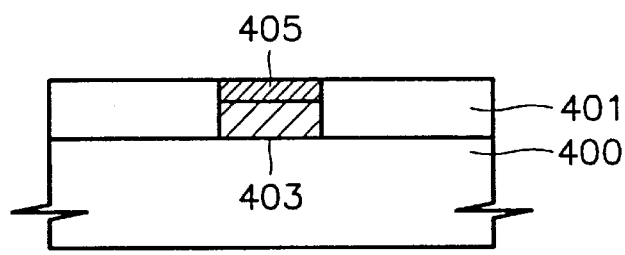

FIG. 4B shows the result of forming an ohmic layer 405. In detail, a native oxide film formed on the conductive plug 403 is eliminated by radio frequency (RF) plasma-etching at 200° C. in an Ar atmosphere at 7 mTorr, and then titanium is deposited to 300 Å on the conductive plug 403 without exposure to air. The resultant structure is thermally treated in a rapid thermal annealer for 30 seconds in an $NH_3$ atmosphere at a temperature of 750° C., to form the ohmic layer 405 of $TiSi_2$. Then, the structure is cleaned by $H_2SO_4$ solution to eliminate unreacted titanium and $Ti_xN_y$ on the surface of the ohmic layer 405.

A heat treatment process is then preferably performed at 700°~800° C. in an atmosphere of $NH_3$ or $N_2$. If the heat treatment is performed at a temperature lower than 700° C. or higher than 800° C., and in an atmosphere of inert Ar gas, the reaction for forming $TiSi_2$ may not be uniform, which may make the surface of the $TiSi_2$ ohmic layer rough. In that case, the thickness of layers that are later deposited may not be uniform.

Figure 4C:
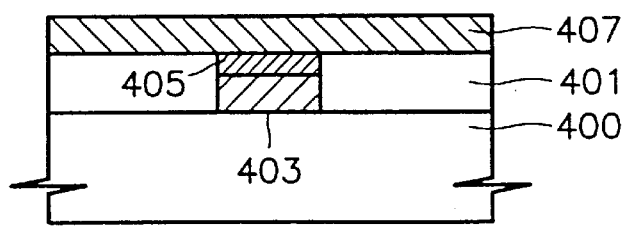
Figure 5:
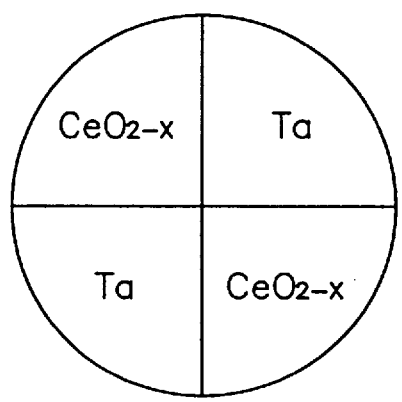
FIG. 5 shows the structure of a target used to form a barrier layer of FIG. 4C.

FIG. 4C shows a result of forming a barrier layer 407. In detail, Ta and $CeO_{2-x}(0 \leq x \leq 1)$ (a grain boundary filling material) are deposited, to form the barrier layer 407 having a thickness of approximately 1000 Å on the ohmic layer 405. The barrier layer 407 can be formed by co-sputtering using a sputter target having at least two targets, i.e., a tantalum target and a $CeO_{2-x}(0 \leq x \leq 1)$ target, as shown in FIG. 5. Preferably, the $CeO_{2-x}$ content in the barrier layer 407 should not exceed 20 atomic percent, and is more preferably approximately 10 atomic percent. Grain boundaries in the barrier layer are preferably filled with the grain boundary filling material, to prevent diffusion of oxygen and metal.

Figure 4D:
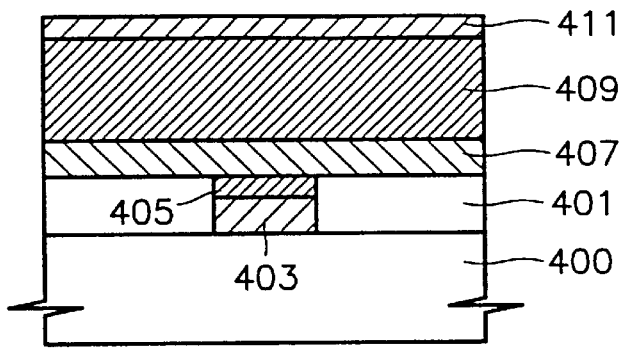

FIG. 4D shows the result of depositing the first lower electrode 409 and the second lower electrode 411. In detail, platinum (a platinum group metal) and $CeO_{2-x}(0 \leq x \leq 1)$ (a grain boundary filling material) are deposited to form the first lower electrode 409 on the barrier layer 407 to a thickness of 500 Å.

Figure 6:
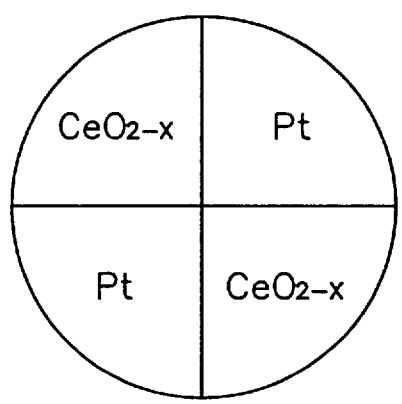
FIG. 6 shows the structure of a target used to form a lower electrode of FIG. 4D.

The first lower electrode 409 can be formed by co-sputtering using a sputter target including at least two targets, i.e., a platinum target and a $CeO_{2-x}(0 \leq x \leq 1)$ target, as shown in FIG. 6. Alternatively, sputtering using a composite target including platinum and $CeO_{2-x}(0 \leq x \leq 1)$ may be employed. The content of $CeO_{2-x}(0 \leq x \leq 1)$ included in the first lower electrode 409 preferably should not exceed 20 atomic percent, and more preferably is approximately 10 atomic percent. Grain boundaries in the platinum are preferably filled with the grain boundary filling material, to prevent diffusion of oxygen and metal. Also, platinum is deposited on the first lower electrode 409 to a thickness of approximately 100 Å, to form a second lower electrode 411.

Figure 4E:
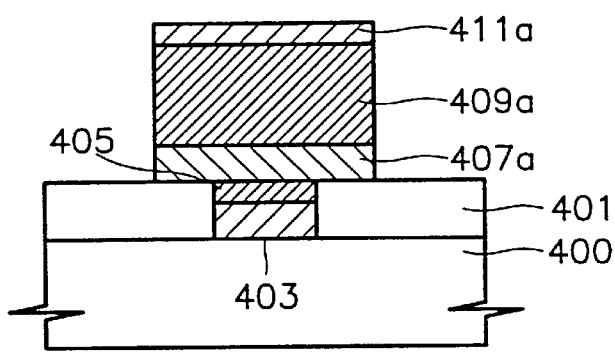

FIG. 4E shows the result of sequentially patterning the second lower electrode 411, the first lower electrode 409 and the barrier layer 407. In detail, the second lower electrode 411, the first lower electrode 409 and the barrier layer 407 are sequentially patterned to from a barrier layer pattern 407a, a first lower electrode pattern 409a and a second lower electrode pattern 411a, respectively.

Figure 4F:
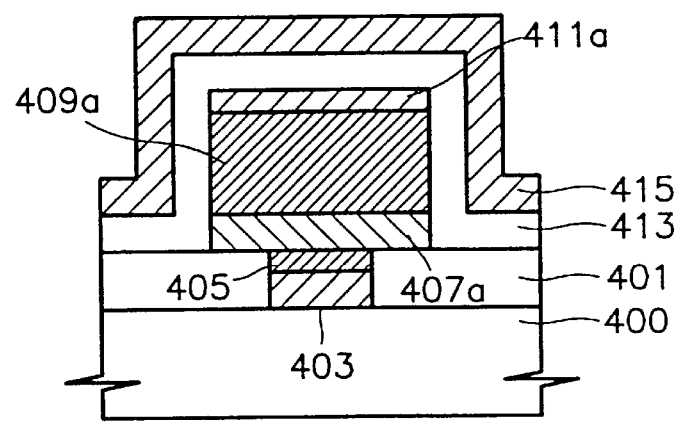

FIG. 4F shows the result of forming a high dielectric constant layer 413 and an upper electrode 415. In detail, BST is deposited on the structure after the patterning step, to form the high dielectric constant layer 413. Platinum is then deposited to form the upper electrode 415. The high dielectric layer 413 can be formed of PZT, STO or $Ta_2O_5$ and the upper electrode 415 can be formed of a platinum group metal, such as Pt, Ir or Ru.

As described above, FIG. 5 shows a target structure for forming the barrier layer 407. The target structure includes a tantalum target and a $CeO_{2-x}(0 \leq x \leq 1)$ target. FIG. 6 shows a target for forming the first lower electrode 409. This target structure includes a platinum target and a $CeO_{2-x}(0 \leq x \leq 1)$ target.

Figure 7:
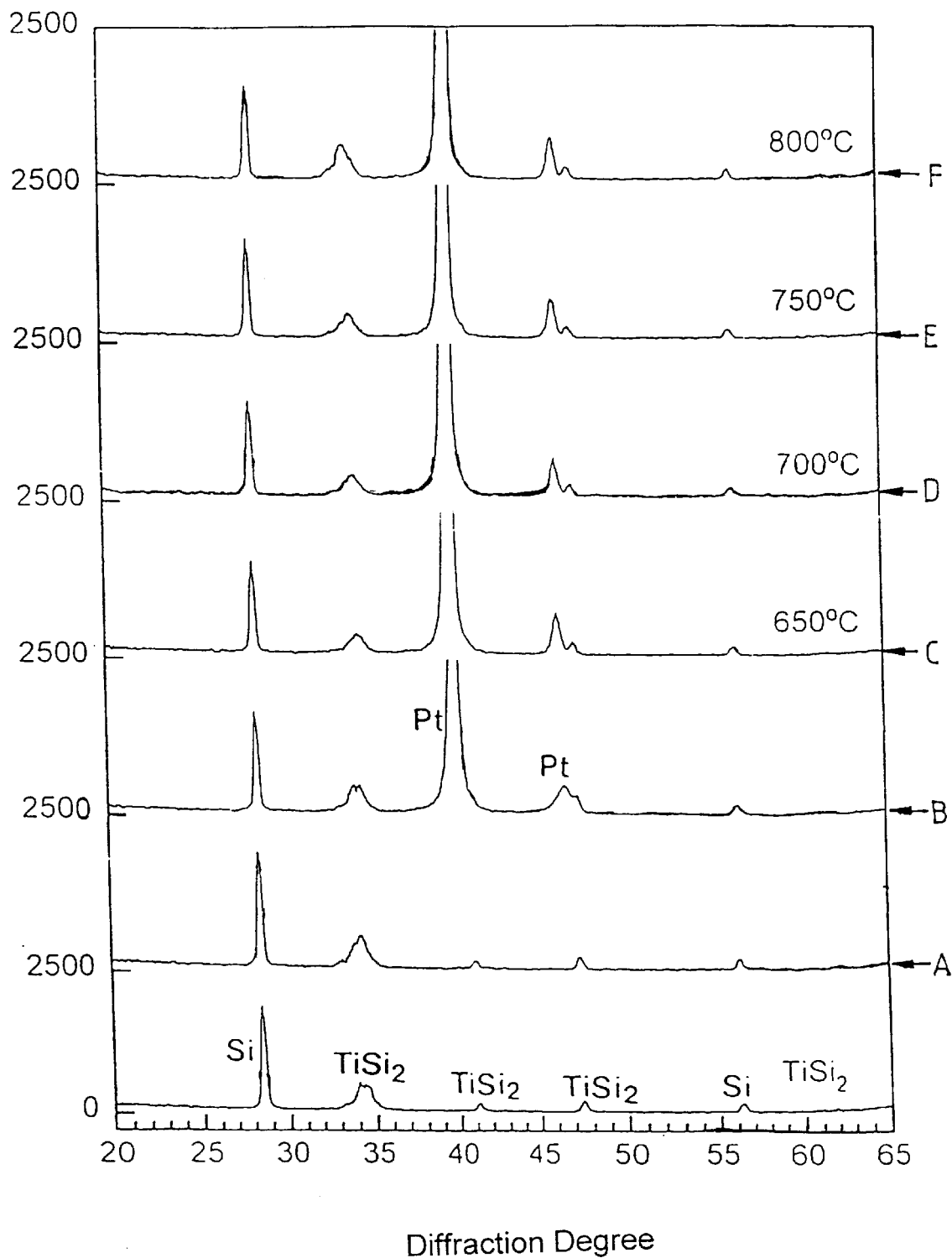
FIG. 7 shows results of X-ray diffraction analysis for high dielectric constant capacitors according to the first embodiment of the present invention.

FIG. 7 illustrates the results of X-ray diffraction analysis performed after high temperature treatment of the structures of FIGS. 4C and 4D. To determine the diffusion reducing capability of the barrier layer 407, it was checked whether $PtSi_x$ was formed by a reaction of the second lower electrode 411 of platinum with the conductive plug 403 of polysilicon. Therefore, an X-ray diffraction test was performed on the resultant structure of FIGS. 4B and 4D, and then on the resultant structure of FIG. 4D which is thermally treated at 650°~800° C. for 30 minutes using an exposed oven.

Referring to FIG. 7, reference character A represents the result of an X-ray diffraction analysis of a structure including an ohmic layer 405, i.e., the semiconductor substrate/polysilicon/$TiSi_2$ structure, as shown in FIG. 4B, and reference character B represents the result of an X-ray diffraction analysis of a structure including the second lower electrode 411, i.e., a semiconductor substrate/polysilicon/$TiSi_2$/Ta+$CeO_2$(500 Å)/Pt+$CeO_2$(500 Å)/Pt(100 Å) structure. It can be seen that the result A is the same as the result of an X-ray diffraction analysis of reference sample having a $TiSi_2$, and a platinum peak is strongly revealed in the result B.

Also, reference characters C, D, E and F represent results of an X-ray diffraction analysis of the structure including the second lower electrode 411, i.e., the semiconductor substrate/polysilicon/$TiSi_2$/Ta+$CeO_2$(100 Å)/Pt+$CeO_2$(500 Å)/Pt(100 Å) structure, as shown in FIG. 4D, at 650° C., 700° C., 750° C. and 800° C., respectively. 'C', 'D', 'E' and 'F' show the same peak as B. This result appears to indicate that Pt, $TiSi_2$ and polysilicon are not diffused into each other, so platinum silicide is not formed.

Figure 8:
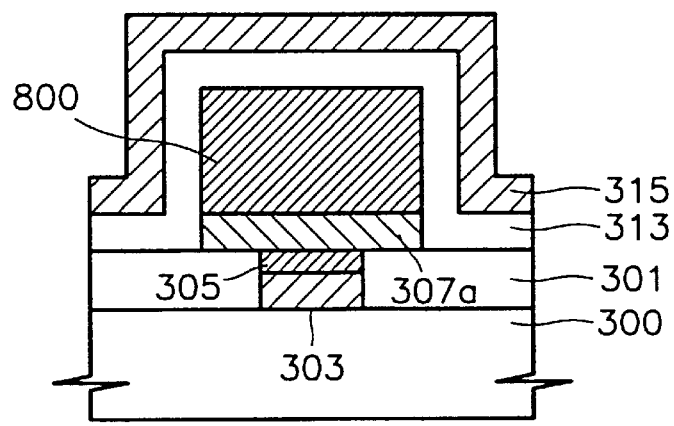
FIG. 8 is a cross-sectional view of high dielectric constant capacitors according to a second embodiment of the present invention.

FIG. 8 shows a high dielectric constant capacitor formed according to a second embodiment of the present invention. The same elements as those in FIG. 3 are assigned the same reference numerals. Except for a lower electrode 800 formed of a single Pt layer including grain boundary filling material such as $CeO_2$, high dielectric constant capacitors formed according to the second embodiment of the present invention are the same as the first embodiment of the present invention.

In the above high dielectric capacitor, the $CeO_2$ filling material of the lower electrode 800 can supply oxygen to an interface between the lower electrode 800 and the high dielectric layer 313, to thereby prevent a fatigue phenomenon that may be caused by oxygen vacancy in the high dielectric layer 313 formed of ferroelectric material such as PZT.

Figure 9:
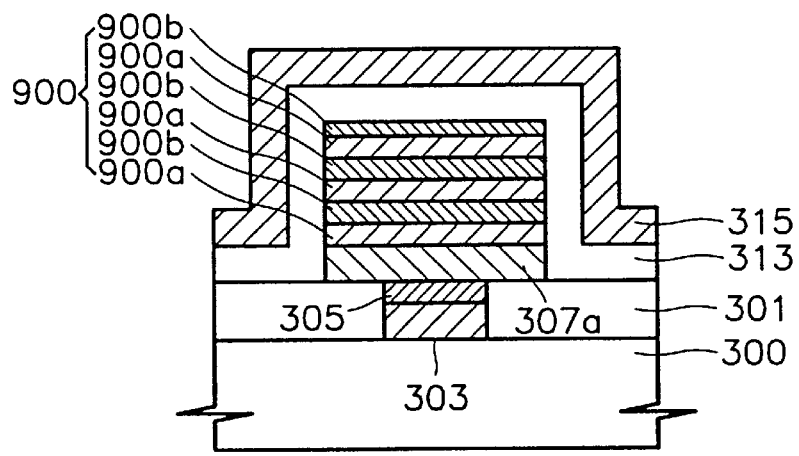
FIG. 9 is a cross-sectional view of high dielectric constant capacitors according to a third embodiment of the present invention.

FIG. 9 shows high dielectric constant capacitors according to a third embodiment of the present invention. The same elements as those in FIG. 3 are assigned the same reference numerals. FIG. 9 includes a lower electrode 900 having a multilayered structure of at least two double layers each having a Pt layer 900a including filling material such as $CeO_2$, and a Pt-layer 900b which does not include the filling material. High dielectric constant capacitors according to the third embodiment of the present invention otherwise are the same as the first embodiment of the present invention, as shown in FIG. 3. These high dielectric capacitors may more effectively reduce oxygen flow.

Figure 10:
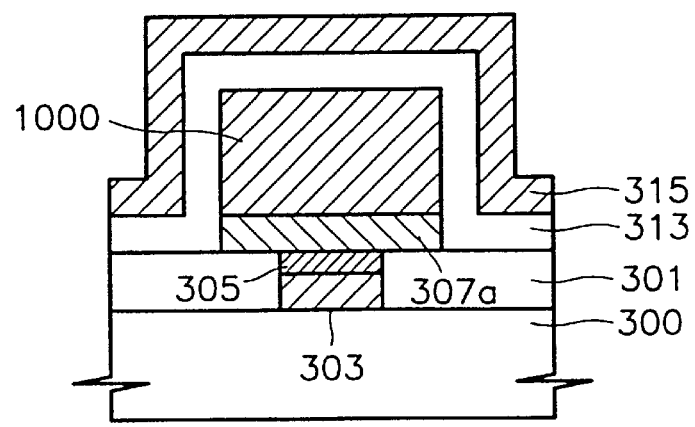
FIG. 10 is a cross-sectional view of high dielectric constant capacitors according to a fourth embodiment of the present invention.

FIG. 10 shows high dielectric constant capacitors according to a fourth embodiment of the present invention. The same elements as those in FIG. 3 are assigned by the same reference numerals.

FIG. 10 includes a lower electrode 1000 formed of a metal of the platinum group, which does not include filling material or oxides thereof. High dielectric constant capacitors according to the fourth embodiment of the present invention otherwise are the same as the first embodiment of the present invention as shown in FIG. 3. Stated differently, in high dielectric constant capacitors according to the fourth embodiment, only the barrier layer pattern 307a includes the filling material.

According to the present invention, the diffusion reducing functions of a barrier layer and an electrode layer may be enhanced, so that high dielectric constant capacitors of high reliability may be obtained. In particular, diffusion of the metal or oxygen can be reduced and preferably prevented, even when using barrier layers having thicknesses of approximately 100 Å. Therefore, the area in which a layer other than platinum contacts the high dielectric layer can be reduced and preferably minimized, to thereby obtain high dielectric constant capacitors having enhanced diffusion preventing characteristics and excellent leakage current characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit capacitor comprising:
   a conductive plug on an integrated circuit substrate;
   a barrier layer comprising refractory metal and barrier layer grain boundary filling material, on the conductive plug;
   a lower electrode comprising platinum group metal and lower electrode grain boundary filling material on the barrier layer;
   a high dielectric constant layer on the lower electrode; and
   an upper electrode on the high dielectric constant layer.

2. A capacitor according to claim 1 wherein the barrier layer grain boundary filling material comprises at least one material selected from the group consisting of Ce, Zr, Y, Th, Hf, La, Al and oxides thereof.

3. A capacitor according to claim 1 wherein the barrier layer grain boundary filling material is less than 20 atomic percent of the barrier layer.

4. A capacitor according to claim 1 further comprising an ohmic layer between the conductive plug and the barrier layer.

5. A capacitor according to claim 4 wherein the ohmic layer comprises titanium silicide.

6. A conductive electrode according to claim 1 wherein the lower electrode grain boundary filling material comprises at least one material selected from the group consisting of Ce, Zr, Y, Th, Hf, La, Al and oxides thereof.

7. A conductive electrode according to claim 1 wherein the lower electrode grain boundary filling material is less than 20 atomic percent of the barrier layer.

8. An integrated circuit capacitor comprising:
a conductive plug on an integrated circuit substrate:
a barrier layer comprising refractory metal and barrier layer grain boundary filling material, on the conductive plug;
a lower electrode on the barrier layer:
a high dielectric constant layer on the lower electrode; and
an upper electrode on the high dielectric constant layer, wherein the lower electrode comprises:
a first lower electrode layer comprising platinum group metal and lower electrode grain boundary filling material on the barrier layer; and
a second lower electrode layer comprising platinum group metal that is free of grain boundary filling material on the first lower electrode layer.

9. A capacitor according to claim 8 wherein the barrier layer grain boundary filling material comprises at least one material selected from the group consisting of Ce, Zr, Y, Th, Hf, La, Al and oxides thereof.

10. A capacitor according to claim 8 wherein the barrier layer grain boundary filling material is less than 20 atomic percent of the barrier layer.

11. A capacitor according to claim 6 further comprising an ohmic layer between the conductive plug and the barrier layer.

12. A capacitor according to claim 11 wherein the ohmic layer comprises titanium silicide.

13. A capacitor according to claim 8 wherein the lower electrode grain boundary filling material is at least one material selected from the group consisting of Ce, Zr, Y, Th, Hf, La, Al and oxides thereof.

14. A capacitor according to claim 8 wherein the lower electrode grain boundary filling material is less than 20 atomic percent of the barrier layer.

15. An integrated circuit conductive electrode comprising:
a conductive plug on an integrated circuit substrate;
a barrier layer comprising refractory metal and barrier layer grain boundary filling material, on the conductive plug; and
an electrode layer comprising platinum group metal and electrode grain boundary filling material on the barrier layer.

16. A conductive electrode according to claim 15 wherein the barrier layer grain boundary filling material comprises at least one material selected from the group consisting of Ce, Zr, Y, Th, Hf, La, Al and oxides thereof.

17. A conductive electrode according to claim 15 wherein the barrier layer grain boundary filling material is less than 20 atomic percent of the barrier layer.

18. A conductive electrode according to claim 15 wherein the electrode grain boundary filling material comprises at least one material selected from the group consisting of Ce, Zr, Y, Th, Hf, La, Al and oxides thereof.

19. A conductive electrode according to claim 15 wherein the electrode grain boundary filling material is less than 20 atomic percent of the barrier layer.

20. An integrated circuit conductive electrode comprising:
a conductive plug on an integrated circuit substrate;
a barrier layer comprising refractory metal and barrier layer grain boundary filling material, on the conductive plug; and
an electrode layer on the barrier layer;
wherein the electrode layer comprises:
a first electrode layer comprising platinum group metal and electrode grain boundary filling material on the barrier layer; and
a second electrode layer comprising platinum group metal that is free of grain boundary filling material on the first electrode layer.

21. A conductive electrode according to claim 20 wherein the barrier layer grain boundary filling material comprises at least one material selected from the group consisting of Ce, Zr, Y, Th, Hf, La, Al and oxides thereof.

22. A conductive electrode according to claim 20 wherein the barrier layer grain boundary filling material is less than 20 atomic percent of the barrier layer.

23. A conductive electrode according to claim 20 further comprising an ohmic layer between the conductive plug and the barrier layer.

24. A conductive electrode according to claim 23 wherein the ohmic layer comprises titanium silicide.

25. A conductive electrode according to claim 20 wherein the electrode grain boundary filling material comprises at least one material selected from the group consisting of Ce, Zr, Y, Th, Hf, La, Al and oxides thereof.

26. A conductive electrode according to claim 20 wherein the electrode grain boundary filling material is less than 20 atomic percent of the barrier layer.

27. An integrated circuit conductive electrode comprising:
an electrode layer comprising platinum group metal and grain boundary filling material.

28. A conductive electrode according to claim 27 wherein the grain boundary filling material is at least one material selected from the group consisting of Ce, Zr, Y, Th, Hf, La, Al and oxides thereof.

29. A conductive electrode according to claim 27 wherein the grain boundary filling material is less than 20 atomic percent of the barrier layer.

30. An integrated circuit conductive electrode comprising:
a first electrode layer comprising platinum group metal and grain boundary filling material; and
a second electrode layer comprising platinum group metal that is free of grain boundary filling material on the first electrode layer.

31. A conductive electrode according to claim 30 wherein the grain boundary filling material is at least one material selected from the group consisting of Ce, Zr, Y, Th, Hf, La, Al and oxides thereof.

32. A conductive electrode according to claim 30 wherein the grain boundary filling material is less than 20 atomic percent of the barrier layer.

* * * * *